United States Patent
Lee et al.

(10) Patent No.: US 8,031,021 B2
(45) Date of Patent: Oct. 4, 2011

(54) OSCILLATION CIRCUIT BASED ON METAL-INSULATOR TRANSITION DEVICE AND METHOD OF DRIVING THE OSCILLATION CIRCUIT

(75) Inventors: Yong-Wook Lee, Daejeon (KR); Bongjun Kim, Daejeon (KR); Sungyoul Choi, Ulsan (KR); Jungwook Lim, Daejeon (KR); Sun-Jin Yun, Daejeon (KR); Byung-Gyu Chae, Daejeon (KR); Hyun-Tak Kim, Daejeon (KR); Gyungock Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 99 days.

(21) Appl. No.: 12/516,105

(22) PCT Filed: Oct. 31, 2007

(86) PCT No.: PCT/KR2007/005476
§ 371 (c)(1),
(2), (4) Date: May 22, 2009

(87) PCT Pub. No.: WO2008/062956
PCT Pub. Date: May 29, 2008

(65) Prior Publication Data
US 2010/0060369 A1    Mar. 11, 2010

(30) Foreign Application Priority Data

Nov. 23, 2006  (KR) .................. 10-2006-0116594
Apr. 27, 2007  (KR) .................. 10-2007-0041618

(51) Int. Cl.
*H03B 11/00*    (2006.01)
(52) U.S. Cl. .................. 331/165; 331/107 R; 331/173; 331/187; 327/596

(58) Field of Classification Search .......... 257/173–175, 257/310, 368; 327/596; 331/65, 87, 107 R, 331/165, 166, 172–174, 187; 438/2, 301
See application file for complete search history.

(56) References Cited

U.S. PATENT DOCUMENTS
3,731,249 A * 5/1973 Lipsicas et al. ............... 338/325
(Continued)

FOREIGN PATENT DOCUMENTS
KR    2005-0038834    4/2005
(Continued)

OTHER PUBLICATIONS

Gunn, J., "Microwave oscillations pf current in III V semiconductors", Solid State Communications, vol. 1, No. 4, pp. 88-91.
(Continued)

*Primary Examiner* — Levi Gannon
(74) *Attorney, Agent, or Firm* — Rabin & Berdo, P.C.

(57) ABSTRACT

Provided are an oscillatory circuit based on a metal-insulator transition (MIT) device that can generate a simple and very high oscillating frequency using the MIT device, and a method of driving the oscillatory circuit. The oscillatory circuit includes the MIT device that comprises an MIT thin film and an electrode thin film connected to the MIT thin film and in which an abrupt MIT is generated due to an MIT generating voltage, a resistor that is serially connected to the MIT device, an electric al power source limiting the maximum amount of an applied current and applying a direct current constant voltage to the MIT device, and a light source irradiating electromagnetic waves on the MIT device, wherein the oscillating properties are generated by irradiating the electromagnetic waves using the light source.

18 Claims, 6 Drawing Sheets

U.S. PATENT DOCUMENTS

| | | |
|---|---|---|
| 6,365,913 B1 | 4/2002 | Misewich et al. |
| 6,555,393 B2 | 4/2003 | Schrott et al. |
| 6,624,463 B2 | 9/2003 | Kim et al. |
| 6,987,290 B2 | 1/2006 | Kim et al. |
| 2005/0098836 A1* | 5/2005 | Kim et al. .................. 257/379 |

FOREIGN PATENT DOCUMENTS

| | | |
|---|---|---|
| KR | 2005-0043431 | 5/2005 |
| KR | 2006-0101208 | 9/2006 |
| KR | 0668347 | 1/2007 |
| KR | 2007-01 15571 | 12/2007 |
| WO | WO-2005-041308 | 5/2005 |

OTHER PUBLICATIONS

Sawano, F. et al., "An organic thyristor", Nature, vol. 437, Sep. 22, 2005, pp. 522-524.

* cited by examiner

OSCILLATION CIRCUIT BASED ON METAL-INSULATOR TRANSITION DEVICE AND METHOD OF DRIVING THE OSCILLATION CIRCUIT

TECHNICAL FIELD

The present invention relates to a metal-insulator transition (MIT) device, and more particularly, to a circuit by which an oscillation phenomenon can be observed using the MIT device.

BACKGROUND ART

Recently, research has been actively conducted on an insulator of which the resistance is changed by an externally applied voltage. In particular, also, experiments have been recently attempted in order to examine the reason why in a metal-insulator transition (MIT) material an abrupt transition is generated from an insulator to a metal (Hyun-Tak Kim et al., New Journal of Physics, vol. 6, p 52, 2004). The MIT material can be manufactured as a two-terminal or three-terminal device by forming the MIT material on a substrate and electrodes on the MIT material. In addition, the MIT device manufactured likewise can be applied to various electronic devices. For example, the patent (U.S. Pat. No. 6,624,463 B2, 23 Sep. 2003, Hyun-Tak Kim et al.) discloses an MIT material that can be used as a field effect transistor.

When a voltage that is applied to an MIT device exceeds a specific voltage (hereinafter, referred to as an 'MIT generating voltage'), the MIT device has electrical properties that a current is abruptly increased (or the resistance is abruptly reduced) and that an insulator state is transited into a metal state. The electrical properties of the MIT device, as described above, can be used in various electronic devices used in various applications. However, the MIT device has never been used to generate an oscillation phenomenon as yet.

Research conducted on examining the oscillating properties of the voltage and current have been reported until now as follows. In the past, an oscillation phenomenon of the voltage and current of a III-V Group based semiconductor has been reported and such phenomenon is called a Gunn effect. This report explains that the oscillation phenomenon is generated by the nubility change of electrical charges. Recently, the oscillation phenomenon has been reported even in an organic material. In detail, when a circuit is configured with a structure in which a thin film resistor directly contacts a conductive organic salt material of which the resistance is greatly changed according to a voltage that is applied from the outside, and an external voltage that is greater than a specific value is applied to the circuit, the oscillating properties are generated in current flowing through the circuit. Thus, it has been construed that the resistance of the conductive organic salt material is changed since charge ordering is changed. In the oscillation of the material of the III-V Group and an organic material, an oscillating waveform is in a shape of a sinusoidal wave that continuously changes. In addition, the oscillating frequency generated in an oscillating element formed of the organic material is very low.

Thereby, to embody a conventional oscillating element such as a thyristor or an oscillator, an amplifier and a feedback loop must be configured. Moreover, to embody the amplifier and the feedback loop, there is a need for various electrical elements (e.g., a transistor, a capacitor and an inductor) in addition to resistors. Accordingly, a conventional oscillating element using various electrical elements has a limit in miniaturization and is disadvantageous in terms of cost.

DISCLOSURE OF INVENTION

Technical Problem

The present invention provides an oscillatory circuit based on a metal-insulator transition (MIT) device that can generate a simple and very high oscillating frequency by using the MIT device and a method of driving the oscillatory circuit.

Technical Solution

According to an aspect of the present invention, there is provided an oscillatory circuit based on an MIT device including: the MIT device that comprises an MIT thin film and an electrode thin film connected to the MIT thin film and in which an abrupt MIT is generated by an MIT generating voltage; a resistor that is serially connected to the MIT device; an electric al power source that can limit the maximum amount of an applied current and supply a direct current (DC) constant voltage to the MIT device; and a light source irradiating electromagnetic waves on the MIT device, wherein the oscillating properties of the oscillatory circuit are generated by irradiating the electromagnetic waves using the light source.

The light source may be an infrared light source, and as the intensity of infrared beams of the light source is increased, the MIT generating voltage of the MIT device is reduced in proportion to the light intensity. Accordingly, when a predetermined DC constant voltage is applied to the MIT device, the intensity of the infrared beams may be regulated so that the abrupt MIT of the MIT device is generated or not generated. The oscillation phenomena may be initiated by the generation of the abrupt MIT. Thus, the oscillating properties of the oscillatory circuit may be generated by irradiating infrared light having an intensity large enough to make the abrupt MIT be generated with a predetermined DC voltage applied to the MIT device.

According to another aspect of the present invention, there is provided an oscillatory circuit based on an MIT device including the MIT device that comprises an MIT thin film and an electrode thin film connected to the MIT thin film and in which an abrupt MIT is generated by an MIT generating voltage; a resistor that is serially connected to the MIT device; and an electric al power source supplying a short pulse voltage to the MIT device, wherein the oscillating properties of the oscillatory circuit are generated by applying the short pulse voltage to the MIT device.

A peak value of the short pulse voltage that is applied from the electric al power source may be greater than the MIT generating voltage. A pulse width of the short pulse voltage may have a size so as to maintain the Joule heat generated from the MIT device to a minimum. For example, the pulse width of the short pulse voltage may be 100 µs. Meanwhile, the oscillating properties of the oscillatory circuit may be maintained during a pulse width of the short pulse voltage.

According to the present invention, the MIT device may be manufactured to have a horizontal structure or in a vertical structure. The MIT thin film may include at least one of an oxide layer material including at least one selected from the group consisting of $Al_2O_3$, $VO_2$, $V_2O_3$, $ZrO_2$, $ZnO$, $HfO_2$, $CuO$, $Ta_2O_5$, $La_2O_3$, $Fe_2O_3$, $NiO$ and $MgO$, an oxide layer material comprising at least one selected from the group consisting of $Al_xTi_yO$, $Zn_xTi_yO$, $Zr_xTi_yO$, $Ta_xTi_yO$, $V_xTi_yO$, $La_xTi_yO$, $Ba_xTi_yO$ and $Sr_xTi_yO$, and a semi-conductor material comprising at least one selected from the group consisting of GaAS, GaSb, InP, InAs, GST (GeSbTe), Si and Ge.

The MIT thin film may include at least one selected from the group consisting of a p-type inorganic semiconductor, a p-type inorganic insulator, a p-type organic semi-conductor, and a p-type organic insulator to which holes having a low concentration are added. The MIT thin film may include at least one selected from the group consisting of oxygen, carbon, Si, Ge, a semiconductor material (III-V Group and II-IV Group), a transition element, a rare earth element and lanthanide. Here, the concentration of the added hole may be $3 \times 10^{16}$ cm$^{-3}$. Meanwhile, the MIT thin film may include an n type semiconductor and an insulator.

The resistance of the resistor may be changed from 1 mΩ through 1 MΩ according to the voltage-current characteristics of the MIT device. The oscillatory circuit may include at least one of a capacitor and an inductor that are connected in series, in parallel or in series-parallel to at least one of the electric al power source, the MIT device and the resistor. The oscillatory circuit may be used in an apparatus or a system in which the oscillating properties are required. For example, the apparatus may convert a DC voltage and current into an alternating voltage and current.

The oscillating properties may be generated in the oscillatory circuit by irradiating infrared beams using the light source.

The oscillating properties are generated by regulating an intensity of the infrared beams irradiated on the MIT device so that the abrupt MIT of the MIT device is generated or not generated with a predetermined DC voltage applied to the MIT device.

The oscillating properties may be generated in the oscillatory circuit by applying a short pulse voltage supplied by an electric power source that applies the short pulse voltage to the MIT device.

Since the oscillatory circuit based on the MIT device according to the present invention has a function in which DC voltage and current is converted into alternating voltage and current, this function can be effectively used in electronic devices (e.g., a thyristor, an oscillator, an MIT solar battery, and an MIT light emitting device) in which the MIT phenomenon is used.

Meanwhile, the oscillatory circuit based on the MIT device according to the present invention can obtain the oscillating properties by adding one resistor, and thus an oscillating circuit can be manufactured small in size, and an oscillating frequency from several to several hundreds kHz can be obtained.

ADVANTAGEOUS EFFECTS

In the oscillatory circuit based on the MIT device according to the present invention and a method of driving the oscillatory circuit, the oscillatory circuit can be simply configured using the MIT device and the resistor. That is, to embody a conventional thyristor or oscillator, various electrical elements such as an amplifier, a feedback loop or the like are required; however, the oscillatory circuit based on the MIT device according to the present invention can be configured by only adding a resistor that is serially connected to the MIT device.

In addition, the oscillatory circuit based on the MIT device according to the present invention can simply generate and not generate the oscillation phenomenon by regulating the intensity of infrared beams or the amplitude of an applied voltage, and can generate an oscillating frequency that is increased more than 100 through 10000 higher than that of a conventional oscillating element using an organic material.

Meanwhile, since the oscillatory circuit based on the MIT device according to the present invention has a function in which direct current voltage and current is converted into alternating voltage and current, this function can be effectively used in electronic devices (e.g., a thyrister, an oscillator, an MIT solar battery, an MIT light emitting device) in which the MIT phenomenon is used.

DESCRIPTION OF DRAWINGS

The above and other features and advantages of the present invention will become more apparent by describing in detail exemplary embodiments thereof with reference to the attached drawings in which.

BEST MODE

The present invention will now be described more fully with reference to the accompanying drawings, in which exemplary embodiments of the present invention are shown. Throughout the specification, it will also be understood that when an element such as layer, region, or substrate is referred to as being on another element, it can be directly on the other element, or intervening elements may also be present. In the drawings, the thickness of layers and region are exaggerated for clarity, and parts having no connection with the descriptions are omitted. Like reference numerals in the drawings denote like elements. The present invention may, however, be embodied in many different forms and should not be construed as being limited to the embodiments set forth herein; rather, these embodiments are provided so that this disclosure will be thorough and complete, and will fully convey the concept of the present invention to one skilled in the art.

Figure 1:
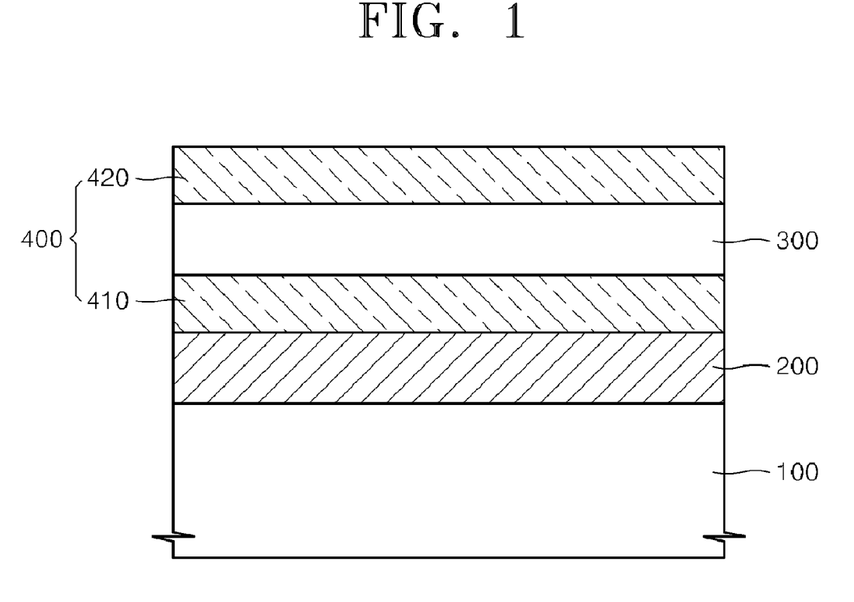
FIG. 1 is a cross-sectional view of a vertical type metal-insulator transition (MIT) device, according to an embodiment of the present invention.

FIG. 1 is a cross-sectional view of a vertical type metal-insulator transition (MIT) device, according to an embodiment of the present invention.

Referring to FIG. 1, the vertical type MIT device includes a substrate 100, a buffer layer 200 formed on the substrate 100, and a first electrode thin film 410, an MIT thin film 300 and a second electrode thin film 420 that are sequentially formed on the buffer layer 200.

The buffer layer 200 reduces lattice mismatch between the substrate 100 and the first electrode thin film 410. When the lattice mismatch between the substrate 100 and the first electrode thin film 410 is very low, the first electrode thin film 410 can be directly formed on the substrate 100 without using the buffer layer 200. The buffer layer 200 may include a $SiO_2$ or $Si_3N_4$ layer.

The MIT thin film 300 may include at least one selected from the group consisting of a p-type inorganic semiconductor, a p-type inorganic insulator, a p-type organic semi-conductor and a p-type organic insulator to which holes having a low concentration are added. Such materials forming the MIT thin film 300 may include at least one selected from the group consisting of oxygen, carbon, Si, Ge, a semiconductor material (III-V Groups and II-IV Group), a transition element, a rare earth element and lanthanide. For example, the MIT thin film 300 may be formed of a compound such as GaAS, GaSb, InP, InAs and GST (GeSbTe), and a semiconductor material such as Si and Ge. Also, the MIT thin film 300 may include an n-type semiconductor having a very high resistance and an insulator. In this case, the concentration of the added holes is about $3 \times 10^{16}$ $cm^{-3}$.

In particular, the MIT thin film 300 may include at least one of an oxide layer material including at least one selected from the group consisting of $Al_2O_3$, $VO_2$, $V_2O_3$, $ZrO_2$, ZnO, $HfO_2$, CuO, $Ta_2O_5$, $La_2O_3$, $Fe_2O_3$, NiO and MgO, an oxide layer material including at least one selected from the group consisting of $Al_xTi_yO$, $Zn_xTi_yO$, $Zr_xTi_yO$, $Ta_xTi_yO$, $V_xTi_yO$, $La_xTi_yO$, $Ba_xTi_yO$ and $Sr_xTi_yO$, and a semiconductor material including at least one selected from the group consisting of GaAS, GaSb, InP, InAs, GST (GeSbTe), Si, and Ge.

The MIT thin film 300 may be formed using a method from any one of a sputtering, a molecular beam epitaxy (MBE), an e-beam evaporation, a thermal evaporation, an atomic layer epitaxy (ALE), a pulsed laser deposition (PLD), a chemical vapor deposition (CVD), a Sol-Gel and an atomic layer deposition (ALD).

An electrode thin film 400 may include at least one selected from the group consisting of Al, Cu, Ni, W, Mo, Cr, Zn, Mg, Fe, Co, Sn, Pb, Au, Ag, Pt, Ti, Ta, TaN, TaW, WN, TiN, TiW, poly-Si and an oxide electrode. Here, the oxide electrode is IrO, RuO, InSnO(InO:Sn), ZnO or the like.

The substrate 100 may be formed of at least one selected from the group consisting of Si, $SiO_2$, GaAs, $Al_2O_3$, plastic, glass, $V_2O_5$, $PrBa_2Cu_3O_7$, $YBa_2Cu_3O_7$, MgO, $SrTiO_3$, $SrTiO_3$ doped with Nb and a silicon on insulator (SOI).

The electrical properties of the MIT device, according to the present invention, are abruptly changed according to a voltage that is applied to the MIT device. That is, if a voltage less than an MIT generating voltage is applied to the MIT device, the MIT device has the properties of an insulator. If a voltage equal to and greater than the MIT generating voltage is applied to the MIT device, an abrupt MIT is generated so as to have the properties of a metal.

Figure 2A:
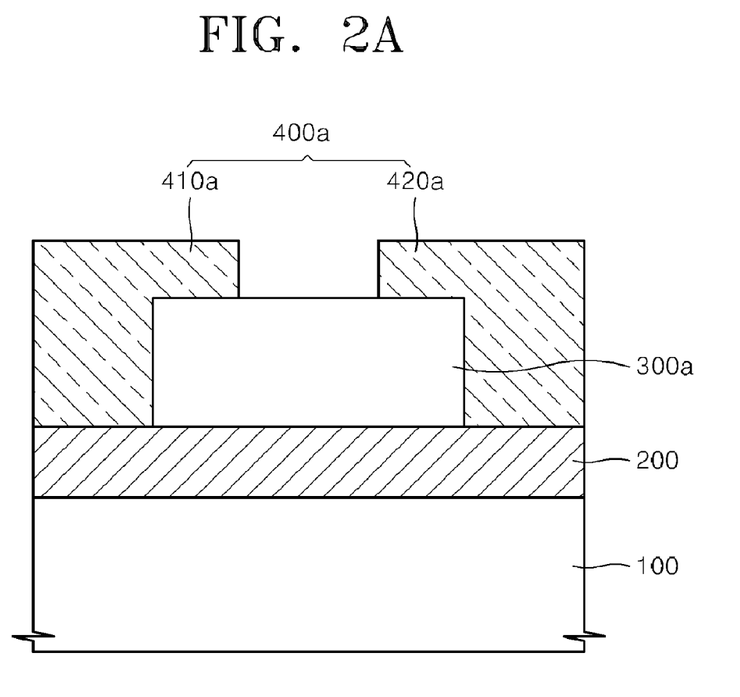
FIGS. 2A and 2B respectively are a cross-sectional view and a plane view of a horizontal type MIT device, according to embodiments of the present invention.

FIG. 2A is a cross-sectional view of a horizontal type MIT device, according to another embodiment of the present invention.

Referring to FIG. 2A, the horizontal type MIT device includes a substrate 100, a buffer layer 200 formed on the substrate 100, an MIT thin film 300a partially formed on a top surface of the buffer layer 200, and a first electrode thin film 410a and a second electrode thin film 420a formed on the buffer layer 200 so as to respectively contact one side surface and a part of the top surface of the MIT thin film 300a, and the other side surface, which faces the one side surface, and a part of the top surface of the MIT thin film 300a. That is, the first electrode thin film 410a and the second electrode thin film 420a are separated from each other by the MIT thin film 300a.

The buffer layer 200 reduces lattice mismatch between the MIT thin film 300a and the substrate 100. If the lattice mismatch between the substrate 100 and the MIT thin film 300a is very low, the MIT thin film 300a can be directly formed on the substrate 100 without using the buffer layer 200.

The buffer layer 200, the MIT thin film 300a, an electrode thin film 400a, and the substrate 100 may be respectively formed of the materials as described in FIG. 1. The vertical and horizontal type MIT devices can be manufactured small in size in micro meter (μm) dimensions, and can be economically manufactured at a very low cost.

Figure 2B:
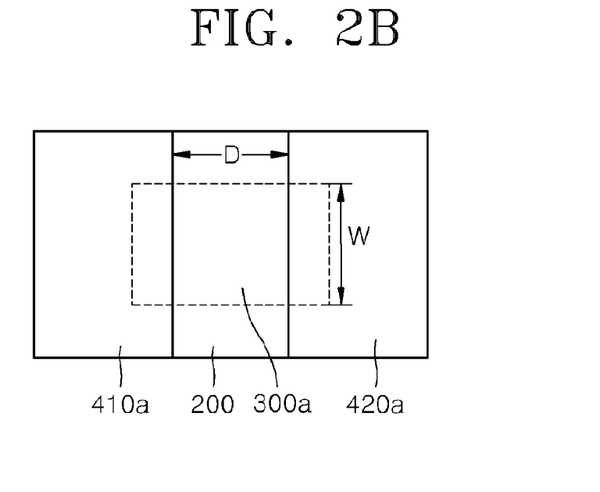

FIG. 2B is a plan view of the horizontal MIT device of FIG. 2A. Referring to FIG. 2B, the buffer layer 200 of the MIT device, the MIT thin film 300a, and the first and second electrode thin films 410a and 420b are illustrated. As described above, the MIT device generates the abrupt MIT when a voltage equal to and greater than the MIT generating voltage is applied to the MIT device. However, the MIT generating voltage may be different depending on the structure of the MIT device. For example, by changing a distance D between the first and second electrode thin films 410a and 420a or a width W of the MIT thin film 300a, the MIT generating voltage can be changed.

Figure 3:
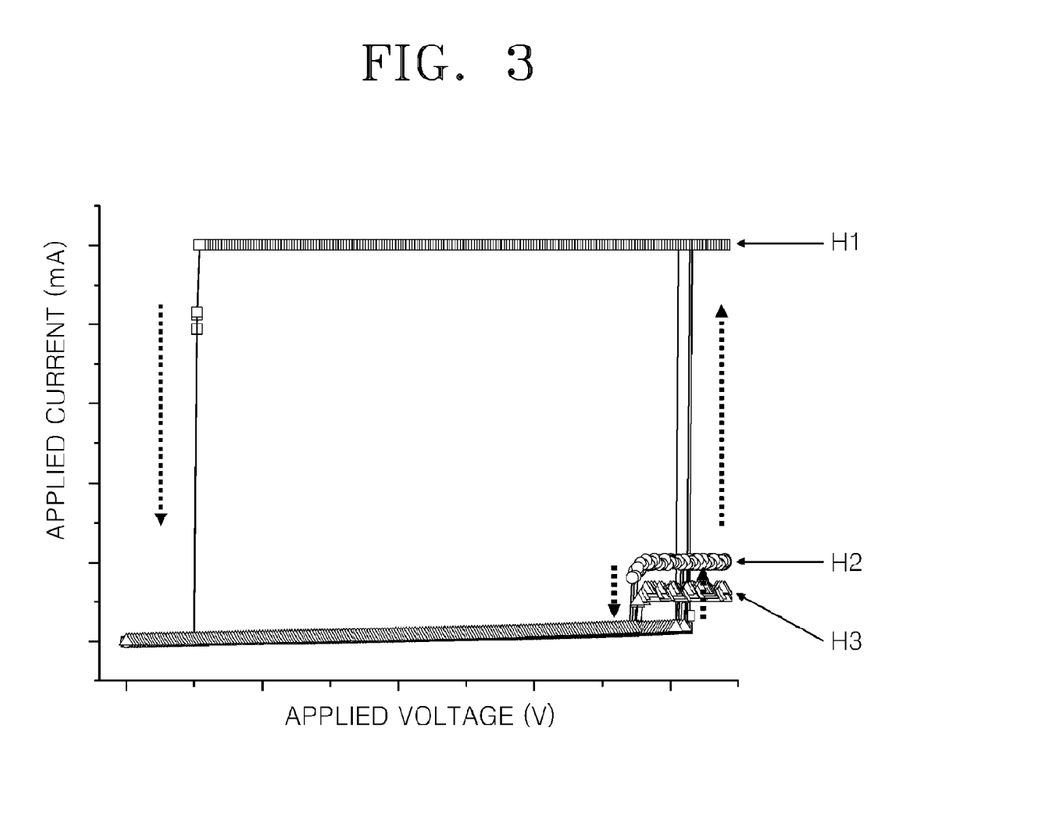
FIG. 3 is a graph illustrating a voltage-current hysteresis curve of the MIT device, according to generation and disappearance of a abrupt MIT of an MIT device, where a hysteresis width is proportion to the maximum applied current.

FIG. 3 is a graph illustrating a voltage-current hysteresis curve of the MIT device, according to generation and disappearance of an abrupt MIT of an MIT device, where a hysteresis width is proportion to the maximum applied current. Referring to FIG. 3, when a voltage (hereinafter, referred to as an 'MIT disappearing voltage') having a pre-determined voltage difference with respect to an MIT generating voltage is applied to the MIT device, an MIT disappears.

Thus, an oscillation phenomenon of the MIT device can be generated using the properties of the voltage-current hysteresis curve of the MIT device, and the oscillation phenomenon generated in the MIT device will be simply described by referring to FIG. 3. In the current embodiment of the present invention, resistors having a predetermined resistance are serially connected to the MIT device.

Initially, most of the voltage, which is applied through an electrical power source, is applied to the MIT device since the MIT device has the properties of an insulator. When a voltage that is applied to the MIT device is equal to and exceeds the MIT generating voltage, a current is abruptly increased in the MIT device. That is, a discontinuous current jump occurs because the MIT device has the properties of a metal, and thus, the resistance of the MIT device is abruptly reduced. Thus, most of the voltage, which is applied through an electrical power source, is applied to the resistors, and only a tiny amount of the voltage is applied to the MIT device.

Accordingly, the voltage that is applied to the MIT device becomes less than the MIT disappearing voltage, and thus, the MIT device acts as an insulator again, and the resistance of the MIT device is abruptly increased. That is, a current flowing through the MIT device is abruptly reduced, and then, most of the voltage, which is applied through an electrical power source, is again applied to the MIT device. At this point, the voltage that is applied to the MIT device is equal to and exceeds the MIT generating voltage again, and thus, a current flowing through the MIT device is abruptly increased. In addition, due to such abrupt increase in the current, a voltage that is applied to the MIT device becomes less than the MIT disappearing voltage again, and the resistance of the MIT device is increased, and thus, a current flowing through the MIT device is abruptly reduced. As a result, the oscillation phenomenon in the MIT device is generated by repeating such processes as described-above.

It can be seen that the hysteresis width is different according to the magnitude of an applied current. That is, in the case where a high current H1 is applied, a large hysteresis width is seen. In the case where a low current H3 is applied, a small hysteresis width is seen. The hysteresis width is different depending on the applied currents since the hysteresis width increases in proportion to the Joule heat generated due to the current flowing through the MIT device. That is, as the applied current is increased, the Joule heat is further generated, and thus, an MIT voltage-current hysteresis width of the MIT device increases. When the MIT voltage-current hysteresis width increases, after the current has been abruptly increased, it is quite probable that the voltage that is applied to the MIT device does not become less than the MIT disappearing voltage. That is, there is a low probability that the applied current returns to a value prior to generation of the abrupt MIT, and accordingly, it is difficult to observe the oscillation phenomenon in the MIT device.

Accordingly, to easily observe the oscillation phenomenon, it is important that the hysteresis width be maintained so as not to be wide in the current-voltage curve of the MIT device during measurements. For example, the MIT device is connected to a resistor having an appropriate resistance so as to satisfy the conditions for the oscillation phenomenon of the MIT device to occur, and the MIT generating voltage of the MIT device and an applied voltage by the electrical power source are properly regulated. Thus, the oscillation phenomenon can be observed with respect to the voltage that is applied to the MIT device.

In terms of an overall oscillatory circuit, since the applied voltage is a direct current voltage, a complementary voltage-oscillation effect for a voltage that is applied to the resistor is generated. In addition, since the applied current of the oscillatory circuit has the same phase as that of the applied voltage, the oscillation effect is generated for the applied current flowing through the oscillatory circuit. A specific oscillatory circuit related to the oscillation phenomenon and the oscillation phenomenon in the specific oscillatory circuit will be later described in detail by referring to FIGS. 6 and 9.

Figure 4:
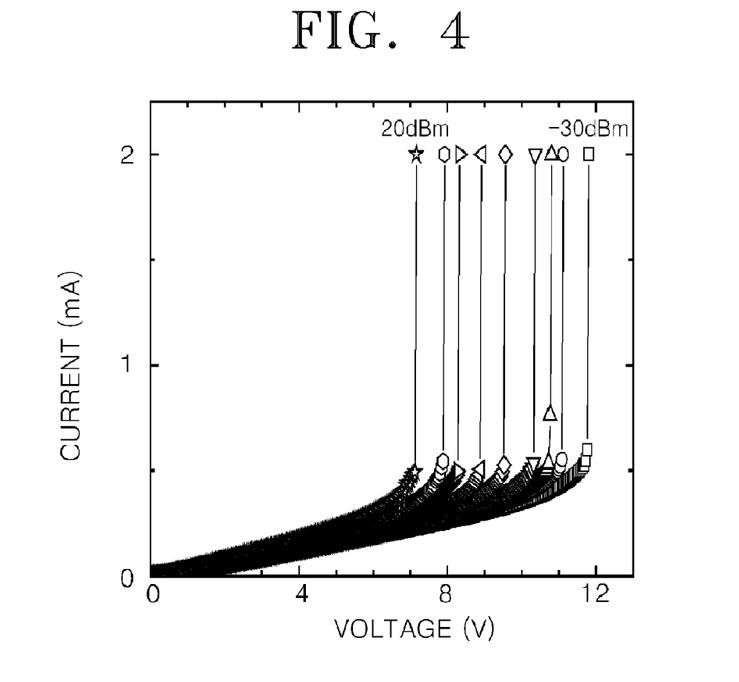
FIG. 4 is a graph illustrating the properties in which an MIT generating voltage is changed according to an intensity of infrared beams that are irradiated on the MIT device.

FIG. 4 is a graph illustrating the characteristics in which an MIT generating voltage is changed according to an intensity of infrared beams that are irradiated on the MIT device, according to an embodiment of the present invention. In particular, the graph illustrates the current-voltage characteristics measured by irradiating electromagnetic waves having a wavelength of 1.55 μm on the MIT device, specifically, an MIT thin film.

Referring to FIG. 4, it can be seen that the MIT generating voltage is reduced as an optical power of the irradiated electromagnetic waves is increased. That is, when the electromagnetic waves having an optical power of 20 dBm are irradiated on the MIT device as compared to an optical power of −30 dBm, it can be seen the MIT generating voltage is reduced from about 12 V to 7 V, where dBm is an energy unit that is the same as a power unit. As a result, the MIT generating voltage of the MIT device can be changed by the electromagnetic waves. In addition, the concept, in which the MIT generating voltage can be changed by the electromagnetic waves, can be construed as the concept in which a MIT generating voltage can be changed by radiant waves such as infrared beams.

Figure 5:
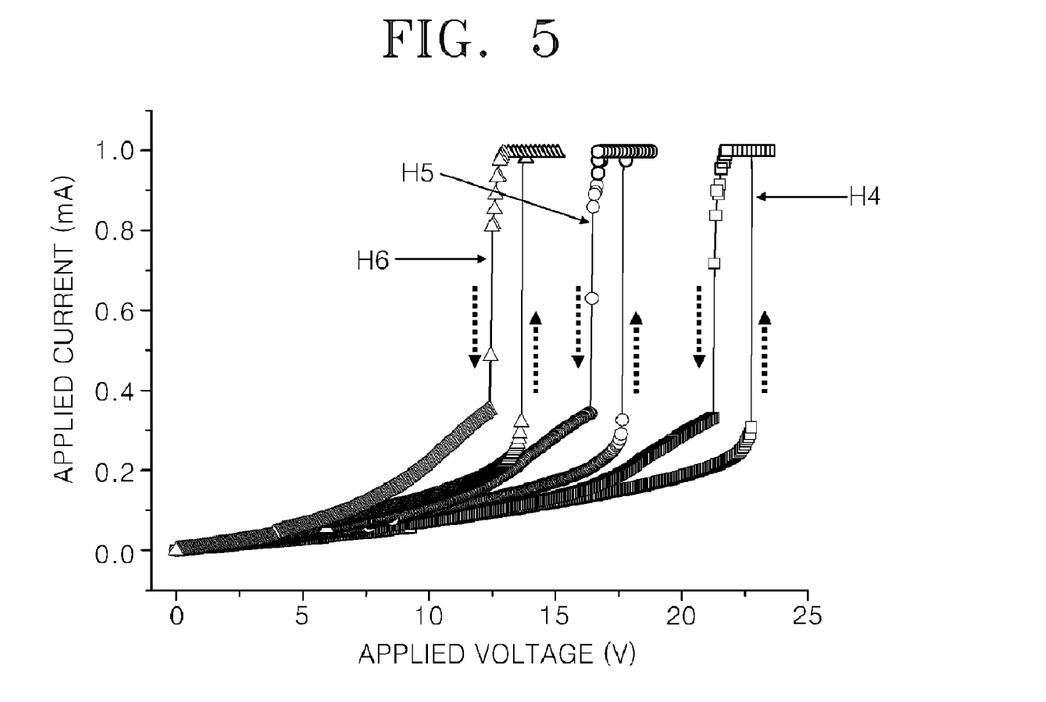
FIG. 5 is a graph illustrating the characteristics in which a voltage-current hysteresis curve is moved according to an intensity of infrared beams when the maximum magnitude of an applied current is fixed and the infrared beams are irradiated on the MIT device.

FIG. 5 is a graph illustrating the characteristics in which a voltage-current hysteresis curve is moved according to an intensity of infrared beams that are irradiated on the MIT device when the maximum magnitude of an applied current is fixed, according to an embodiment of the present invention. That is, by limiting the maximum amount of the applied current so that the amount of current flowing through a circuit may not be high even after an abrupt MIT is generated, an MIT voltage-current hysteresis width is maintained to be small so that Joule heat may be minimized, and MIT oscillations may be generated.

For example, the maximum amount of the applied current is fixed to 1 mA in order to reduce the Joule heat, and a light source of infrared beams having a wavelength of 1.55 μμm is used in order to regulate the MIT generating and disappearing voltages. Thus, as in the graph, as the intensity of the infrared beams is changed, a voltage-current hysteresis curve of an MIT device is observed. As seen from the graph, the MIT generating and disappearing voltages are moved according to the intensity of the infrared beams, and accordingly the voltage-current hysteresis curve is moved. As observed in FIG. 4, this is a naturally expected result according to the characteristics in which the MIT generating voltage is moved according to the intensity of the infrared beams.

Accordingly, by regulating the intensity of the infrared beams of a light source, the MIT generating and disappearing voltages of the MIT device can be regulated. As a result, an infrared light source can be used as a driving switch of the oscillation phenomenon of the MIT device. In FIG. 5, the left hysteresis curve H6 is a graph of the case where infrared beams having a strong intensity are irradiated on the MIT device. The right hysteresis curve H4 is a graph of the case where infrared beams having a weak intensity are irradiated or never irradiated on the MIT device. Thus, it can be seen that as the intensity of the infrared beams is increased, the hysteresis curve is gradually moved to the left.

Hereinafter, a specific oscillatory circuit and the oscillation phenomenon of the oscillatory circuit will be described according to embodiments of the present invention. Two methods, which will be hereinafter described, are exemplary, and the present invention is not limited to these methods. Accordingly, voltage, current, resistance, time, frequency, the wavelength of a light source, intensity of a light source or the like, which are suggested in the description of the drawings, are exemplary so as to illustrate the oscillation phenomenon of the oscillatory circuit based on the MIT device, however, the present invention is not limited thereto.

According to the embodiments of the present invention, a horizontal type MIT two-terminal device is used, which includes an MIT thin film formed on the substrate as the horizontal type MIT device in FIG. 2A and two electrode thin films formed on both ends of the MIT thin film. Here, the MIT thin films used in the current embodiment of the present invention are formed of $VO_2$. The width W of each of the MIT thin film is about 10 μm. A distance D between the two electrode thin films is about 30 μm.

Figure 6:
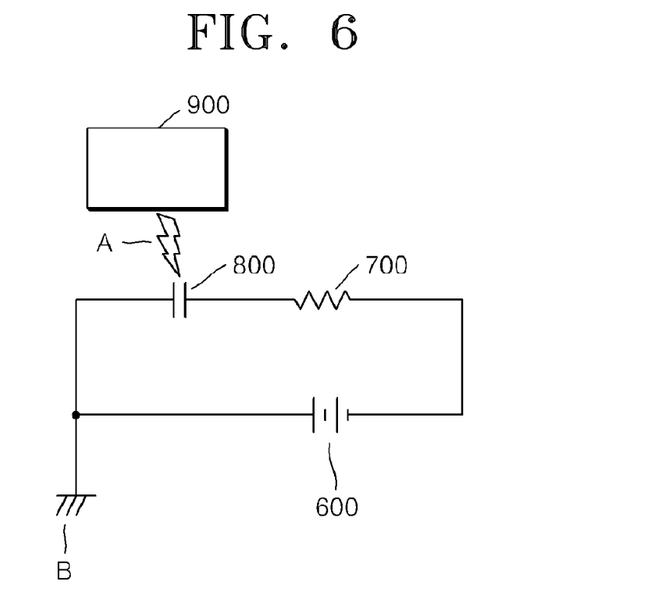
FIG. 6 is a circuit diagram in which an infrared light source is used for observing an oscillation phenomenon in an MIT device, according to an embodiment of the present invention.

FIG. 6 is a circuit diagram of an MIT oscillatory circuit in which an infrared light source is used for observing an oscillation phenomenon in an MIT device 800, according to an embodiment of the present invention.

Referring to FIG. 6, the MIT oscillatory circuit based on the MIT device 800 according to the current embodiment of the present invention includes the MIT device 800 having the horizontal structure, a resistor 700 serially connected to the MIT device 800, an electrical power source 600 limiting the maximum amount of an applied current and supplying a DC constant voltage to the MIT device 800, and a light source 900 irradiating electromagnetic waves A to the MIT device 800. Although not illustrated, if necessary, the MIT oscillatory circuit may include at least one of a capacitor and an inductor that are connected in series, in parallel or in series-parallel to the electrical power source 600, the MIT device 800, the resistor 700 or the like.

The oscillation phenomenon is generated in the MIT oscillatory circuit according to the current embodiment of the present invention as follows.

First, if the maximum amount of the applied current is limited to 1 mA by the electrical power source 600, a DC constant voltage is applied such that an abrupt MIT may not be generated. In the case where this operation is applied to the case of the hysteresis curve illustrated in FIG. 5, a voltage of about 19 V is applied to a circuit by the electrical power source 600. That is, when infrared beams are not irradiated on the MIT device 800, a voltage, which is a little less than the MIT generating voltage, is applied to the circuit. Here, the current limitation means that the electrical power source 600 reduces a voltage that is applied to the circuit until the amount of the current becomes less than 1 mA when the amount of the applied current is greater than 1 mA.

Then, the light source 900 is controlled to have an appropriate intensity so as to condense infrared beams, and the light source 900 irradiates the infrared beams on the MIT device 800, specifically, an MIT thin film of the MIT device 800. Also, in the case where this operation is applied to the case of the hysteresis curve illustrated in FIG. 5, the infrared beams are irradiated on the MIT device 800 at an intensity corresponding to the middle hysteresis curve H5. When the infrared beams are irradiated on the MIT device 800, the MIT generating voltage becomes less than the voltage that has already been applied to the MIT device 800, that is, 19 V, and the abrupt MIT is generated in the MIT device 800.

Then, due to the abrupt increase in the current, the voltage that is applied to the MIT device 800 is abruptly reduced. However, due to the limited maximum amount of the applied current, the MIT voltage-current hysteresis width of the MIT device is maintained within 2 V, which immediately reduces the increased current to a value prior to the generation of MIT. That is, a resistance of the MIT device 800 is abruptly increased, and thus, due to the abruptly increased resistance of the MIT device 800, a voltage that is applied to the MIT device is again abruptly increased. At this point, the abrupt MIT is again generated in the MIT device. Thus, the current is abruptly increased. Also, after that, by repeating the operations described above, the oscillation phenomenon is observed by the voltage that is applied to the MIT device 800.

Figure 7:
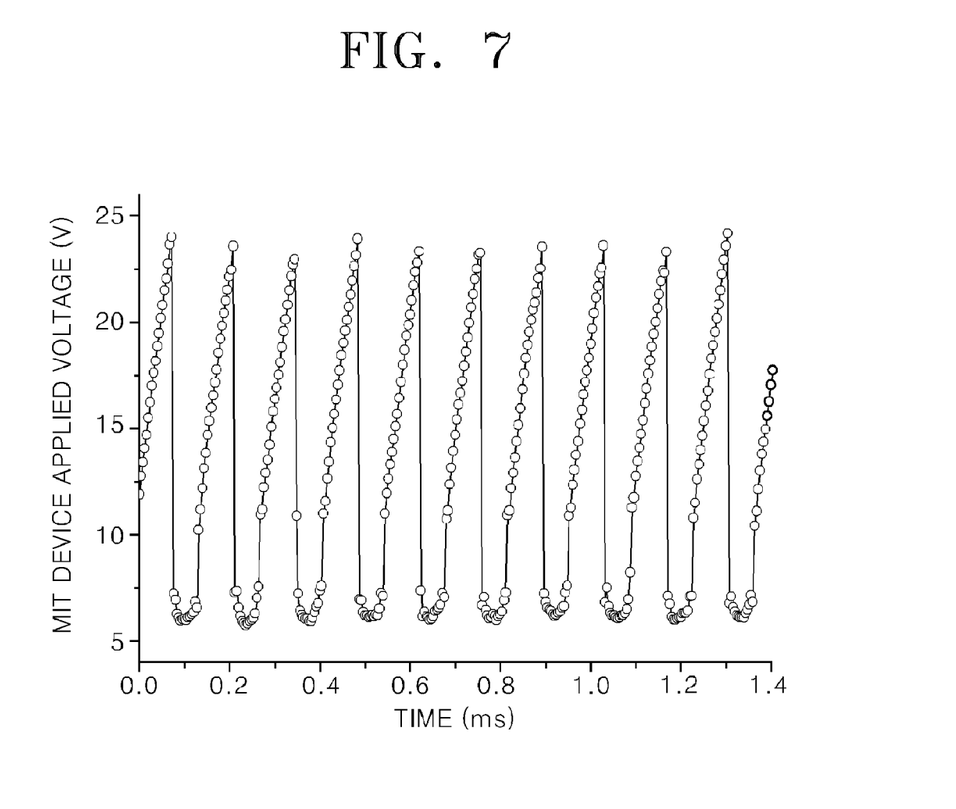
FIG. 7 is a graph illustrating data measuring the voltage oscillation phenomenon generated in the MIT device in the circuit diagram of FIG. 6.

FIG. 7 is a graph illustrating data resulting from a measurement of a voltage oscillation phenomenon generated in the MIT device 800 in the circuit diagram of FIG. 6.

Referring to FIG. 7, it can be seen that the oscillation phenomenon by a voltage that is applied to the MIT device 800 has an oscillating waveform having a period of about 0.14 ms, that is, a frequency of about 7.3 kHz. The oscillation phenomenon of the MIT device 800 is maintained only while infrared beams are irradiated by the light source 900. When the condensed infrared beams are blocked from irradiating on the MIT device 800, the oscillation phenomenon of the MIT device disappears.

In addition, to protect the MIT device 800 and obtain an oscillating waveform having an appropriate frequency, the resistance of the resistor 700 connected to the MIT device 800 can be changed from several hundreds of Ω to several tens of kΩ according to the voltage-current characteristics of the MIT device.

Figure 8:
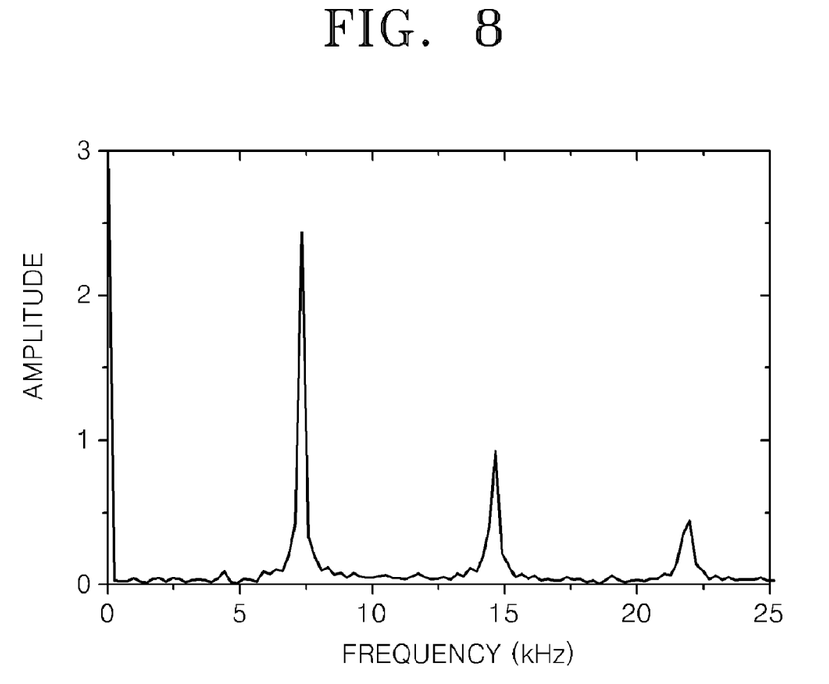
FIG. 8 is a graph illustrating a result of the case where a fast Fourier transform is performed on the voltage oscillation waveform illustrated in FIG. 7, according to an embodiment of the present invention.

FIG. 8 is a graph illustrating a result of the case where a fast Fourier transform is performed on the voltage oscillation waveform illustrated in FIG. 7, according to an embodiment of the present invention.

Referring to FIG. 8, as illustrated in the graph in FIG. 7, when infrared beams are irradiated on the MIT oscillatory circuit of FIG. 6 and the MIT oscillation is observed, it can be seen that a fundamental frequency of the voltage oscillation waveform of the MIT device 800 is about 7.3 kHz.

Figure 9:
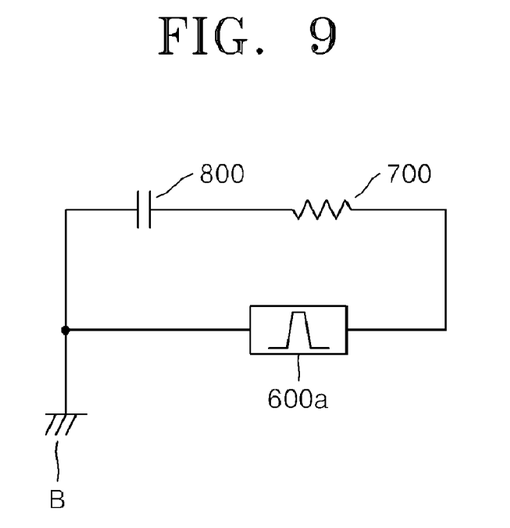
FIG. 9 is a circuit diagram of an oscillatory circuit based on an MIT device in which a voltage having a short pulse is used for observing an oscillation phenomenon, according to another embodiment of the present invention.

FIG. 9 is a circuit diagram of an oscillatory circuit based on an MIT device 800 in which a voltage having a short pulse is applied for observing an oscillation phenomenon, according to another embodiment of the present invention.

Referring to FIG. 9, the oscillatory circuit based on the MIT device 800 according to the current embodiment of the present invention includes a horizontal type MIT device as illustrated in FIG. 2a, an electrical power source 600a that supplies the voltage having the short pulse to the MIT device 800, and a resistor 700 that is serially connected to the MIT device 800. As obvious to one skilled in the art, if necessary, the MIT oscillatory circuit may include at least one of a capacitor and an inductor that are connected in series, in parallel or in series-parallel to the electrical power source 600a, the MIT device 800, the resistor 700 or the like.

The oscillatory circuit according to the current embodiment of the present invention uses the electrical power source 600a that supplies the voltage having the short pulse in order to minimize the generated Joule heat by reducing the time during which a current flows. Likewise, in the case where the voltage having a short pulse is applied, the time, during which a large current flows through the MIT device 800 even after an abrupt MIT is generated in the MIT device 800, can be limited to a short time less than several tens of μs, and accordingly, the Joule heat generated in the MIT device 800 is reduced, and thus, a voltage-current hysteresis width of the MIT device 800 is reduced. Thus, the oscillation phenomenon of the MIT device can be easily observed. At this time, a peak voltage of the applied voltage having a short pulse must be greater than an MIT generating voltage.

The oscillation phenomenon is generated in the MIT oscillatory circuit according to the current embodiment of the present invention as follows.

First, a voltage having a short pulse with a pulse width of about 20 μs is applied to the MIT device 800 through the electrical power source 600a. When the voltage having a short pulse is applied to the MIT device 800, a current is abruptly increased due to a reduction in the resistance of the MIT device 800 from the moment at which the pulse voltage is equal to and exceeds the MIT generating voltage, and accordingly most of the applied voltage is applied to the resistor 700. Then, the voltage that is applied to the MIT device 800 becomes less than the MIT disappearing voltage. Accordingly, the resistance of the MIT device 800 is again abruptly increased, and the applied current returns to a value prior to generation of MIT. The applied current returns to the value prior to the generation of MIT since due to the short time that is less than several tens of μs during which the current is supplied, Joule heat is minimized, and accordingly, the MIT voltage-current hysteresis width of the MIT device 800 is maintained small.

Then, due to the resistance of the MIT device 800 that is abruptly increased, a voltage that is applied to the MIT device 800 is abruptly increased, and simultaneously exceeds the MIT generating voltage. Thus, the abrupt MIT is again generated, and a current is abruptly increased. Then, by repeating the operations described above, the oscillation phenomenon for the voltage that is applied to the MIT device 800 is observed.

Figure 10:
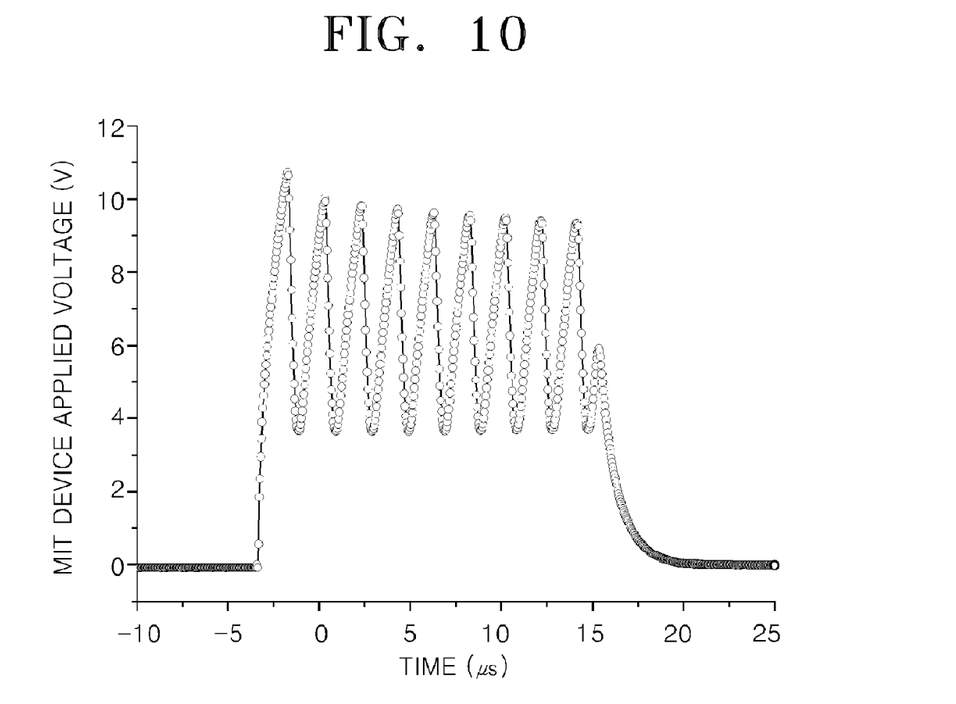
FIG. 10 is a graph illustrating data resulting from a measurement of the voltage osciliation phenomenon generated in the MIT device in the circuit diagram of FIG. 9, according to an embodiment of the present invention.

FIG. 10 is a graph illustrating data resulting from a measurement of a voltage oscillation phenomenon generated in the MIT device 800 in the circuit diagram of FIG. 9, according to an embodiment of the present invention.

Referring to FIG. 10, it can be seen that the oscillation phenomenon for a voltage that is applied to the MIT device 800 has an oscillating waveform having a period of about 2.05 μs, that is, a frequency of about 488 kHz. The oscillation phenomenon of the MIT device is generated only during a pulse width of a short pulse voltage that is applied to the MIT device 800 through the electrical power source 600a, that is, an interval of about 20 μs. When a pulse voltage is not applied, the MIT oscillation phenomenon also disappears. In addition, when the magnitude of the pulse voltage is reduced less than the MIT disappearing voltage, the oscillation phenomenon disappears.

As described above, to protect the MIT device 800 and obtain an oscillating waveform having an appropriate frequency, the resistance of the resistor 700 connected to the MIT device 800 can be changed from several mΩ to several MΩ according to the voltage-current characteristics of the MIT device 800.

Figure 11:
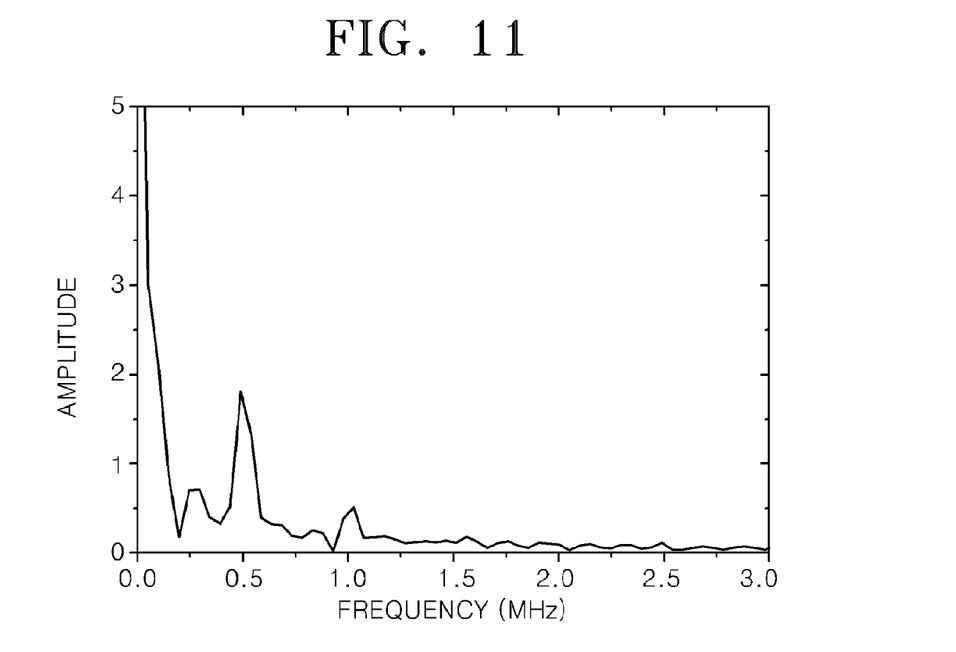
FIG. 11 is a graph illustrating a result of the case where a fast Fourier transform is performed on the voltage oscillation waveform illustrated in FIG. 10.

FIG. 11 is a graph illustrating a result of the case where a fast Fourier transform is performed on the voltage oscillation waveform illustrated in FIG. 10.

Referring to FIG. 11, as illustrated in the graph of FIG. 10, when infrared beams are irradiated the MIT oscillatory circuit of FIG. 9 and MIT oscillation is observed, it can be seen that a fundamental frequency of the oscillating waveform of a voltage that is applied to an MIT device is about 488 kHz.

Compared with oscillations using an organic material as described in the background of the invention, the oscillatory circuit based on the MIT device according to the present invention can be simply configured with a resistor, and can easily induce the oscillating properties using a method in which a direct current voltage is applied to an MIT thin film of the MIT device, and then an electromagnetic wave light source is irradiated on the MIT thin film, or using a method in which an short pulse voltage is applied to the MIT device. In addition, the oscillation phenomenon of the MIT oscillatory circuit based on the MIT device according to the present invention is very different from the oscillation phenomenon using an organic material in that an oscillating waveform has a shape, which is similar to a ramp type, not continuous change, that is, has a drop of voltage with a discontinuity. Furthermore, in terms of an oscillating frequency, the MIT oscillatory circuit based on the MIT device according to the present invention can increase an oscillating frequency to be more than 100 through 10000 times higher than that of an oscillating element using an organic material. For example, it can be seen that the oscillating frequency according the current embodiment of the present invention is in the range of several to several hundreds of kHz.

Since the oscillation phenomenon in the MIT oscillatory circuit based on the MIT device according to the present invention can generate the oscillation phenomenon by simply regulating an intensity of infrared beams or the magnitude of an applied voltage that is applied to the MIT device, the MIT oscillatory circuit can have a function in which the DC voltage and current is converted into alternating voltage and current, and this function can be effectively used in electronic devices (e.g., a thyristor, an oscillator, an MIT electric cell, an MIT light emitting device, an MIT sensor, an MIT two-terminal switching device, an MIT three-terminal switching device (transistor), an MIT memory, an MIT oscillator and an MIT RF device).

As described above, in the oscillatory circuit based on the MIT device according to the present invention and a method of driving the oscillatory circuit, the oscillatory circuit can be simply configured using the MIT device and the resistor. That is, to embody a conventional thyristor or oscillator, various electrical elements such as an amplifier, a feedback loop or the like are required; however, the oscillatory circuit based on the MIT device according to the present invention can be configured by only adding a resistor that is serially connected to the MIT device.

In addition, the oscillatory circuit based on the MIT device according to the present invention can simply generate and not generate the oscillation phenomenon by regulating the intensity of infrared beams or the amplitude of an applied voltage, and can generate an oscillating frequency that is increased more than 100 through 10000 higher than that of a conventional oscillating element using an organic material.

Meanwhile, since the oscillatory circuit based on the MIT device according to the present invention has a function in which direct current voltage and current is converted into alternating voltage and current, this function can be effectively used in electronic devices (e.g., a thyristor, an oscillator, an MIT solar battery, an MIT light emitting device) in which the MIT phenomenon is used.

While the present invention has been particularly shown and described with reference to exemplary embodiments thereof, it will be understood by one of ordinary skill in the art that various changes in form and details may be made therein without departing from the spirit and scope of the present invention as defined by the following claims.

Mode for Invention

INDUSTRIAL APPLICABILITY

The present invention relates to a metal-insulator transition (MIT) device, and more particularly, to a circuit by which an oscillation phenomenon can be observed using the MIT device. In the oscillatory circuit based on the MIT device according to the present invention and a method of driving the oscillatory circuit, the oscillatory circuit can be simply configured using the MIT device and the resistor. That is, to embody a conventional thyristor or oscillator, various electrical elements such as an amplifier, a feedback loop or the like are required; however, the oscillatory circuit based on the MIT device according to the present invention can be configured by only adding a resistor that is serially connected to the MIT device.

The invention claimed is:

1. An oscillatory circuit, comprising:
   an MIT (metal-insulator transition) device that includes an MIT thin film and electrode thin films connected to the MIT thin film and in which an abrupt metal-insulator transition is triggered at an MIT generating voltage;
   a resistor that is serially connected to the MIT device; and
   an electrical power source supplying a short pulse voltage to the MIT device to cause oscillation, wherein the short pulse voltage has a steep leading edge, a steep trailing edge, and an intermediate portion between the edges, the intermediate portion having a voltage that is substantially constant.

2. The oscillatory circuit of claim 1, wherein a peak value of the short pulse voltage that is applied from the electrical power source is greater than the MIT generating voltage.

3. The oscillatory circuit of claim 2, wherein the oscillatory circuit has oscillating properties that are maintained during a pulse width of the short pulse voltage.

4. The oscillatory circuit of claim 1,
wherein the electrode thin films include a first electrode thin film and a second electrode thin film;
wherein the MIT device has a vertical structure and further includes a substrate;
wherein the first electrode thin film is disposed adjacent the substrate;
wherein the MIT thin film is disposed the first electrode thin film and has a low concentration; and
wherein the second electrode thin film is disposed on the MIT thin film.

5. The oscillatory circuit of claim 1,
wherein the electrode thin films include a first electrode thin film and a second electrode thin film;
wherein the MIT device has a horizontal structure and further includes a substrate having a top surface and side surfaces;
wherein the MIT thin film is disposed above part of the top surface of the substrate and has a low concentration;
wherein the first electrode thin film is disposed on the substrate so as to contact one side surface and a part of a top surface of the MIT thin film; and
wherein the second electrode thin film is disposed on the substrate so as to contact another side surface of the substrate and a part of a top surface of the MIT thin film.

6. The oscillatory circuit of claim 1, wherein the MIT thin film comprises at least one of an oxide layer material comprising at least one substance selected from the group consisting of $Al_2O_3$, $VO_2$, $V_2O_3$, $ZrO_2$, ZnO, $HfO_2$, CuO, $Ta_2O_5$, $La_2O_3$, $Fe_2O_3$, NiO and MgO,
an oxide layer material comprising at least one substance selected from the group consisting of $Al_xTi_yO$, $Zn_xTi_yO$, $Zr_xTi_yO$, $Ta_xTi_yO$, $V_xTi_yO$, $La_xTi_yO$, $Ba_xTi_yO$ and $Sr_xTi_yO$, and
a semiconductor material comprising at least one substance selected from the group consisting of GaAS, GaSb, InP, InAs, GST (GeSbTe), Si and Ge.

7. The oscillatory circuit of claim 1, wherein the MIT thin film comprises at least one substance selected from the group consisting of a p-type inorganic semiconductor, a p-type inorganic semiconductor insulator, a p-type organic semiconductor, and a p-type organic insulator to which holes having a low concentration are added.

8. The oscillatory circuit of claim 7, wherein the MIT thin film comprises at least one substance selected from the group consisting of oxygen, carbon, Si, Ge, a semiconductor material (III-V Group and II-IV Group), a transition element, a rare earth element and lanthanide.

9. The oscillatory circuit of claim 1, wherein the MIT thin film comprises an n-type semiconductor and an insulator.

10. The oscillatory circuit of claim 1, wherein the electrode thin film comprises at least one substance selected from the group consisting of Al, Cu, Ni, W, Mo, Cr, Zn, Mg, Fe, Co, Sn, Pb, Au, Ag, Pt, Ti, Ta, TaN, TaW, WN, TiN, TiW, poly-Si, IrO, RuO, InSnO(InO:Sn) and ZnO.

11. The oscillatory circuit of claim 1, wherein the MIT device has voltage-current characteristics and wherein the resistance of the resistor is changed from 1 mΩ through 1 MΩ according to the voltage-current characteristics of the MIT device.

12. The oscillatory circuit of claim 1, wherein the oscillatory circuit further comprises at least one of a capacitor and an inductor that are connected in series, in parallel or in series-parallel to at least one of the electrical power source, the MIT device and the resistor.

13. The oscillatory circuit of claim 1, wherein the oscillatory circuit is used in an apparatus or a system in which oscillating properties of the oscillatory circuit are required.

14. The oscillatory circuit of claim 13, wherein the apparatus converts a DC voltage and current into an alternating voltage and current.

15. The oscillatory circuit of claim 1, wherein the oscillation has a frequency greater than several kHz.

16. The oscillatory circuit of claim 1, further comprising an infrared source for irradiating the MIT device.

17. An oscillatory circuit, comprising:
an MIT (metal-insulator transition) device that includes an MIT thin film and electrode thin films connected to the MIT thin film and in which an abrupt metal-insulator transition is triggered at an MIT generating voltage;
a resistor that is serially connected to the MIT device; and
an electrical power source supplying a short pulse voltage to the MIT device to cause oscillation,
wherein a peak value of the short pulse voltage that is applied from the electrical power source is greater than the MIT generating voltage, and
wherein the short pulse voltage has pulse width that is selected so as to inhibit a Joule heating of the MIT device.

18. An oscillatory circuit, comprising:
an MIT (metal-insulator transition) device that includes an MIT thin film and electrode thin films connected to the MIT thin film and in which an abrupt metal-insulator transition is triggered at an MIT generating voltage;
a resistor that is serially connected to the MIT device; and
an electrical power source supplying a short pulse voltage to the MIT device to cause oscillation,
wherein the oscillatory circuit has oscillating properties that are generated when a peak value of the short pulse voltage is greater than the MIT generating voltage, and a pulse width of the short pulse voltage is set so as to inhibit Joule heating of the MIT device.

* * * * *